United States Patent [19]

Lindmayer

[11] 4,156,622

[45] May 29, 1979

[54] TANTALUM OXIDE ANTIREFLECTIVE COATING AND METHOD OF FORMING SAME

[75] Inventor: Joseph Lindmayer, Bethesda, Md.

[73] Assignee: Solarex Corporation, Rockville, Md.

[21] Appl. No.: 740,670

[22] Filed: Nov. 10, 1976

[51] Int. Cl.² .......................................... H01L 31/06
[52] U.S. Cl. .............................. 136/89 CC; 427/162
[58] Field of Search ................................... 136/89 CC

[56] References Cited

U.S. PATENT DOCUMENTS

| | | | |
|---|---|---|---|
| 3,533,850 | 10/1970 | Tarneja et al. | 136/89 CC |
| 3,904,453 | 9/1975 | Revesz et al. | 156/3 |
| 3,922,774 | 12/1975 | Lindmayer et al. | 29/572 |

OTHER PUBLICATIONS

A. G. Revesz et al., "Film-Substrate Interaction in Si/Ta and Si/Ta$_2$O$_5$ Structures", *J. Electrochem. Soc.*, vol. 123, pp. 1514–1519, Oct. 1976.

A. G. Revesz, "Vitreous Oxide Antireflection Films in High-Efficiency Solar Cells", *Conf. Record, 10th IEEE Photospecialists' Conf.*, Nov. 1973, pp. 180–181.

*Primary Examiner*—Aaron Weisstuch
*Attorney, Agent, or Firm*—Watson, Cole, Grindle & Watson

[57] ABSTRACT

A silicon solar energy cell having an antireflective coating on its light impinging surface. The coating consists essentially of a suboxide of tantalum having the generic formula Ta$_2$O$_y$, in which y is a number between about 2.5 and 4.8 on an atomic ratio basis.

5 Claims, No Drawings

TANTALUM OXIDE ANTIREFLECTIVE COATING AND METHOD OF FORMING SAME

The present invention relates generally to solar energy cells. More specifically, it is directed to antireflective coatings for such cells, which coatings have as their purpose mitigation of reflection of useful light directed against the illuminated surface of the cell.

A semiconductor device may be formed from a wafer of silicon that has previously been doped, causing the wafer to adopt a specific conductivity type. Then a junction is formed by diffusing into the wafer an impurity of the conductivity type opposite to that with which the wafer has previously been doped. As an example, if the wafer has been doped with boron, the silicon wafer will be what is known as p-type. Subsequent diffusion with phosphorus will result in a wafer having a p-n junction near one surface thereof. With such a junction established, radiant energy, usually in the form of light, will be absorbed by the silicon and generate electron-hole pairs, which consist of negatively charged electrons and positively charged holes. The electrons are attracted to the n-type silicon; the positively charged holes go to the p-type silicon. As a consequence, a voltage is generated and an electrical current flows, so that a photovoltaic device has been created. Conductors are positioned at opposite sides of the wafer. The conductors generally take the form of a metallic grid positioned on that surface of the cell that is to be exposed to light, and a metallic contact on the other, back surface of the wafer.

The efficiency of the photovoltaic device thus formed, i.e., its power output measured as a percent of its power input, is dependent on many factors. However, one important criterion in obtaining maximum output is that there be maximum absorption of light energy under any given condition of light availability. Otherwise stated, it is not possible to obtain an output of electricity that will be considered satisfactory if a significant portion of the available light does not enter the solar cell but instead is directed away, that is, reflected from the cell surface.

Entrance of light into a semiconductor device is limited by the difference in the indices of refraction of the medium from which the light enters the cell and that of the silicon semiconductor material, itself. The index of refraction of a silicon wafer is approximately 4.0. When light enters a silicon wafer directly from the air, it is traveling in a medium that has an index of refraction of 1. Consequently, due to the difference in the indices, approximately 35 percent of the light is reflected away from the silicon cell rather than absorbed by it.

Generally, however, a solar cell is not used with an uncoated surface. For space use, the cell is covered by a quartz slide to minimize proton damage; in a terrestrial setting a coating is applied to protect the cell from the terrestrial environment. The index of refraction for glasses and other conventional encapsulating materials, such as silicone rubber, are typically about 1.3 to 1.5.

When a bare silicon solar cell is covered with glass or adhesives having an index of refraction in the range of about 1.3 to 1.5, the reflection of light from the cell is reduced, since such a coating provides an intermediate index of refraction between the high index of the silicon and the unity index of the air. However, it is still highly advisable to provide an antireflective coating for the surface of the cell that is to be exposed to light.

Research has previously been conducted, particularly in the area of solar cells that are to be used in space technology applications, where mitigation of reflected light is especially important. Of the prior art known to me in this regard, U.S. Pat. No. 3,533,850, issued Oct. 13, 1970 to Tarneja et al., and U.S. Pat. No. 3,922,774, issued Dec. 2, 1975 to me and Allison, are deemed to be most directly relevant. While both patents are specific to solar cells to be used in space, where a quartz cover is normally placed over the antireflective coating to protect the cell against injurious radiations, nevertheless Tarneja did disclose several specific materials from which such a coating might be formed. He specifically identified, in order, titanium dioxide, tantalum oxide, cerium oxide, zinc sulphide and tin oxide as being materials that would provide the necessary refractive index yet would not otherwise adversely affect operation of the solar cell. Tarneja calculated that the desired value of the index of refraction is approximately 2.3.

In my U.S. Pat. No. 3,922,774, I disclose that tantalum pentoxide, in that particular setting, is a superior coating, and disclose and claim a specific method of placing an electrode and an antireflective coating of non-crystalline tantalum pentoxide on a cell, which is particularly responsive to light in the blue-violet region of the spectrum. This method was accomplished by evaporating tantalum metal by means of an electron beam and then thermally or anodically oxidizing the tantalum metal to tantalum pentoxide, i.e., $Ta_2O_5$.

The method described by Tarneja et al for applying antireflective material, i.e., $Ta_2O_5$, is to evaporate the tantalum pentoxide directly onto the light-impinging surface of the solar cell. However, the coating produced by the evaporation of tantalum pentoxide, as suggested by Tarneja, has an index of refraction that is much lower than the desired value. Also, the evaporated tantalum oxide does not have desirable short wavelength absorption characteristics. It absorbs too much in the blue, violet and ultraviolet regions of the spectrum. On the other hand, the index of refraction of the amorphous tantalum pentoxide coating produced by the method described in my U.S. Pat. No. 3,922,774 produces a $Ta_2O_5$ having a desirable index of refraction. In addition, that tantalum pentoxide coating is quite transparent to light in the short wavelength frequencies, and therefore does not absorb undesirable quantities of that light.

Certain difficulties have been found in actual production of antireflective coatings on silicon solar cells utilizing the method described in U.S. Pat. No. 3,922,774. According to that method, deposition of a layer of antireflective coating of $Ta_2O_5$ about 600 Å thick is desirable. However, while control of the thickness of the layer deposited can be accomplished using complex instrumentation, when elemental tantalum is deposited on the surface of a solar cell, it is most difficult to determine when the desired thickness of that coating has accumulated, particularly since the tantalum layer is much thinner, i.e., about 200 Å, in order to result in a 600 Å thick layer of $Ta_2O_5$ after oxidation. Elemental tantalum is grey in color. In actual production, it is exceptionally difficult to stop the deposition of elemental tantalum on a solar cell at any specific thickness, for there is no variation in grey color of the tantalum as with a change in thickness. Another difficulty in the use of tantalum metal is that the evaporation requires a large amount of power. In the laboratory such evaporation can be accomplished with expensive instrumentation. In production line manufacture of solar cells having antireflective coatings, the greatly increased power requirements for electron beam evaporation of elemental tantalum and the control problems are multiplied and become uneconomical.

Conversely, at the points where difficulty has been encountered with the method of my patent, the Tarneja method of evaporating $Ta_2O_5$ has been quite effective. Thus, evaporation of $Ta_2O_5$ does not require large amounts of power by the electron beam technique compared to the evaporation of elemental tantalum. In addition, the thickness of the coating of $Ta_2O_5$ can be judged with a degree of accuracy sufficient for mass production of solar cells because there is a change of color of the evaporated layer, specifically from gold to purple to blue as the deposition layer accumulates. Consequently, there are advantages and disadvantages to production of antireflective tantalum oxide coatings on solar cells by the methods of the Tarneja et al and Lindmayer et al patents.

I have now discovered that the best characteristics of both the Tarneja and Lindmayer patent techniques may be accomplished by electron beam evaporation of a mixture of elemental tantalum and tantalum pentoxide. $Ta_2O_2$ can also be utilized. By this method, it is possible to gauge the thickness of the layer of tantalum deposited by simple observation and the amount of power required to evaporate the mixture is considerably less than that necessary to evaporate elemental tantalum. After the deposition of the mixture, a solar cell with an antireflective coating of, e.g., $Ta_2O_{4.2}$ has been formed. The cell is then heated in an oxidizing atmosphere or otherwise oxidized to convert the tantalum oxide so deposited into a substantially stoichiometric tantalum pentoxide, which has the desirable characteristics of being generally transparent to short wavelength light and has an index of refraction in a range of 2.1 to 2.3.

After deposition but before subsequent oxidation, the tantalum suboxide antireflective coating for a silicon solar energy cell that forms a feature of the present inversion has a ratio of Ta to O atoms between that of $Ta_2O_2$ and $Ta_2O_5$. Generally, the range expressed as a function of Ta to O atoms is from $Ta_2O_{2.5}$ to $Ta_2O_{4.7}$. While thicknesses of the layer may vary, the strongly preferred thickness is one-quarter of the wavelength at 0.55 microns, which here is between 600 and 650 A, taking into account the index of refraction of $Ta_2O_5$.

The process of my invention is carried out by means of electron beam evaporation techniques that are known to those of skill in this art, except that the material being evaporated has not, to the best of my knowledge, been so evaporated before as part of a cell coating procedure. In the best mode now known to me, a mixture of tantalum pentoxide and elemental tantalum in a ratio of 3 to 1, pentoxide to metal, is placed in a crucible in a vacuum chamber in which solar cells have been suspended by suitable means so that their light absorbing surfaces are directed toward the crucible. A vacuum of $3\times10^{-5}$ Torr. or below is drawn in the chamber. The electron gun is then activated so that an electron beam is focused on a spot in the mixture of $Ta_2O_5$ and Ta in the crucible. The electron beam may be deflected by means of a magnetic field and swept in a pattern to scan an area within the crucible, thereby efficiently melting the mix. When the melt has formed and evaporation begins to take place, the light-absorbing surfaces of the silicon cells are exposed to the vapors from the melt. Such exposure is continued until a purple or blue color is present on the cell surfaces, according to the precise thickness of coating desired. Then the electron beam is discontinued, the melt permitted to cool, the chamber vented, and the coated cells removed. The coated cells are then heated in air for 30 seconds at 450° C. in order to complete oxidation to a state approaching $Ta_2O_5$, possibly to about $Ta_2O_{4.8}$.

So far as the practical limits of conditions under which the evaporation can take place, these will be apparent to those familiar with electron beam evaporation. Thus, the evaporation can take place in greater vacuums. Heating after the coating has been applied can take place at temperatures of about 400° to 500° C. for periods of about 10 to 60 seconds.

Mixtures of $Ta_2O_5$ to Ta metal have been used or estimated in ratios varying from about 1:2 to 5:1, producing theoretical oxides from $Ta_2O_{2.5}$ to $Ta_2O_{4.54}$ on an atomic basis. A more practical range is one varying from $Ta_2O_{3.3}$ to $Ta_2O_{4.5}$. The optimum ratio used was 3.1, yielding a theoretical maximum $Ta_2O_{4.3}$, although in practice some oxygen will be lost during evaporation. This appears to embody the practical advantages of evaporation of $Ta_2O_5$ and elemental tantalum while avoiding the disadvantages inherent in the evaporation of either $Ta_2O_5$ or elemental tantalum alone.

It will be clear to those skilled in this art that certain alterations and modifications of the preferred embodiments of my invention can be made without departing from the spirit thereof. For example, sputtering rather than evaporative techniques may be employed for deposition of the tantalum suboxide. I therefore desire that all such obvious alterations and modifications be deemed to fall within the scope of that invention, which is to be limited only by the purview of the following, appended claims.

I claim:

1. A solar energy cell comprising a body of silicon having opposed surfaces, one of which is adapted for the impingement of light thereon, and a photovoltaic junction formed inwardly of said surfaces and dividing said body of silicon into zones of opposite conductivity types, and an antireflective coating on said light impinging surface, said coating consisting essentially of a suboxide of tantalum having the formula $Ta_2O_Y$, in which Y is a number between about 2.5 and 4.8 on an atomic ratio basis.

2. A solar energy cell as claimed in claim 1, in which Y is a number between about 3.3 and 4.5.

3. A solar energy cell as claimed in claim 1, in which the thickness of the antireflective coating is about 600 Å.

4. A solar energy cell as claimed in claim 1, in which Y is about 4.3.

5. A solar energy cell as claimed in claim 1, in which the thickness of the antireflective coating is between about 600 to 650 Å.

* * * * *